(12) United States Patent
Hosomi

(10) Patent No.: US 6,768,206 B2
(45) Date of Patent: Jul. 27, 2004

(54) ORGANIC SUBSTRATE FOR FLIP CHIP BONDING

(75) Inventor: Eiichi Hosomi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/141,685

(22) Filed: May 7, 2002

(65) Prior Publication Data

US 2003/0209807 A1 Nov. 13, 2003

(51) Int. Cl.⁷ .............................................. H01L 23/48
(52) U.S. Cl. ..................... 257/774; 257/773; 257/778; 257/786
(58) Field of Search ................................. 257/773, 774, 257/778, 786; 438/108, 612, 629, 637, 639, 640, 667, 668, 672, 675, 700, 701, 713, 978, 666

(56) References Cited

U.S. PATENT DOCUMENTS

| | | | |
|---|---|---|---|
| 5,616,961 A | 4/1997 | Kohyama | |
| 5,686,764 A | 11/1997 | Fulcher | |
| 5,748,550 A | 5/1998 | Jeon et al. | |
| 5,814,891 A | * 9/1998 | Hirano | ......................... 257/778 |
| 5,889,326 A | 3/1999 | Tanaka | |
| 5,895,230 A | * 4/1999 | Bartley | ......................... 438/612 |
| 5,917,229 A | * 6/1999 | Nathan et al. | ............... 257/529 |
| 5,955,788 A | 9/1999 | Iwasa | |
| 5,959,348 A | 9/1999 | Chang et al. | |
| 6,031,258 A | 2/2000 | Ranjan et al. | |
| 6,084,779 A | 7/2000 | Fang | |
| 6,140,710 A | * 10/2000 | Greenberg | ................... 257/786 |
| 6,150,727 A | 11/2000 | Takagi | |
| 6,150,729 A | * 11/2000 | Ghahghahi | ................... 257/786 |
| 6,160,705 A | * 12/2000 | Stearns et al. | ............... 257/737 |
| 6,166,441 A | 12/2000 | Geryk | |
| 6,177,732 B1 | 1/2001 | Zu | |
| 6,310,399 B1 | 10/2001 | Feurle et al. | |
| 6,323,118 B1 | 11/2001 | Shih et al. | |
| 6,340,631 B1 | 1/2002 | Chih-Po et al. | |
| 6,542,377 B1 | * 4/2003 | Fisher et al. | ................. 257/774 |
| 2001/0015497 A1 | * 8/2001 | Zhao et al. | ................. 257/738 |

* cited by examiner

*Primary Examiner*—Steven Loke
*Assistant Examiner*—Quang Vu
(74) *Attorney, Agent, or Firm*—Hogan & Hartson, LLP

(57) ABSTRACT

An exemplary embodiment of the present invention described and shown in the specification and drawings is a substrate that has lattice points and interstitial points. The substrate includes a surface, a plurality pads located on the surface at interstitial points, and a plurality of vias located in the substrate only at lattice points.

16 Claims, 9 Drawing Sheets

ORGANIC SUBSTRATE FOR FLIP CHIP BONDING

FIELD OF THE INVENTION

The present invention relates to semiconductor packaging, and in particular, to an organic substrate for flip chip semiconductor packages.

BACKGROUND OF THE INVENTION

Referring to FIGS. 1 and 2, a flip chip bonding configuration for a semiconductor package 10 that includes a semiconductor die 12 that is mechanically and electrically connected to a supporting substrate 14. Metallic bumps 16 on the bottom surface 18 of the die 12 overlap with metallic pads 20 correspondingly positioned in a die bonding region 22 located on the top surface 24 of the substrate 14. Typically, the metallic bumps 16 are connected to the underlying pads 20 by solder 26, thus providing direct electrical coupling between the die 12 and substrate 14. The direct electrical interconnection between the die 12 and substrate 14 provided by flip chip bonding configuration 10 advantageously eliminates the need for bond wires and results in low resistance and inductance values. Thus, flip chip bonding configurations provide for better signal integrity and power distribution to and from the die 12 than in other bonding technologies such as wire bonding or tape automated bonding.

The bottom surface 18 of the die 12 may include hundreds of metallic bumps 16 with each metallic bump providing an electrical interface to and from the die 12 for various electrical signals, core power, input/output (I/O) power, and ground. Electrical signals, core power, and ground are provided to the die's internal logic circuitry (not shown). Similarly, the I/O power and ground are provided to the die's I/O interface circuitry (not shown), i.e., input and output drivers. The metallic bumps 16, and therefore the corresponding pads 20 on the top surface 24 of the substrate 14, generally are arranged in concentric rectangular rings (not shown) and are spaced apart to prevent electrical shorting between adjacent metallic bumps/pads. However, the metallic bumps 16 and pads 20 may be configured in various patterns other than concentric rectangular rings.

The substrate 14 may be a multi-layer printed circuit board, ceramic substrate or another semiconductor chip. Typically, pads 28 on the bottom surface 30 of the substrate 14 are bonded, e.g., via solder 32, to another printed circuit board referred to as a motherboard 34. The substrate 14 provides for a mechanical and electrical interface between the often densely-packed metallic bumps 16 on the bottom surface 18 of the die 12 to less-densely packed pads (not shown) on the motherboard 34. The pads 28 on the substrate's bottom surface 30 are placed so as to correspond to the pads (not shown) on the motherboard 34.

The various layers of the substrate 14 are formed by the well known processes used to create integrated circuits and printed circuit boards. The individual layers may be comprised of conductive or semiconductor material. Often, the conductive material is a metal, i.e., a copper-based material, which is plated onto semiconductor material layers and patterned by photolithographically removing deposited metal to form pads and traces. The substrate 14 may be referred to as organic if organic material is combined with the copper-based material so as to provide thermal expansion characteristics close to those of the motherboard 34 and to improve reliability in board assembly.

Traces (not shown) electrically interconnect pads 20 or 28 on either the top surface 24 or bottom surface 30 of the substrate 14 or to vias (not shown) which are holes that facilitate the electrical interconnection of the various layers of the substrate 14. The vias may be formed, for example, by mechanical or laser drilling a via hole through a layer or layers of the substrate 14. Surrounding the via hole on each level may be a circular land (not shown) made of a conductive material. Typically, the via hole is filled with a conductive material so that via lands surrounding the via holes on various layers of the substrate are electrically interconnected. A via may extend through to the bottom surface 30 of the substrate 14 and connect to a pad 28. Thus, the pads 20 and 28 on the top surface 24 and bottom surface 30, respectively, of the substrate 14 are interconnected to one another by means of traces and vias. Solder balls 32 are individually connected to each pad 28 for soldering the pads 28 on the bottom surface 30 of the substrate 14 to the corresponding pads (not shown) on the motherboard 34. The solder balls 32 connected to the pads 28 on the bottom surface 30 of the substrate 14 are collectively called a ball grid array 36.

Various electrical characteristics are considered when designing the substrate 14 including maintaining a low DC resistance and AC inductance for power and ground connections to and from the die 12, and maintaining wide spacing between traces (not shown), pads 20 and 28, and via lands (not shown) to minimize the possibility of crosstalk or electrical shorting. Thus, with respect to power distribution for the die 12, the distance between the pads 20 on the top surface 24 of the substrate 14 for core power distribution and the logic circuitry which actually consume the power should be as short as possible.

Recently, many semiconductor packages have been designed using C4 flip chip bonding technology. An exemplary C4 bonding technology pad arrangement 38 is shown in the top plan view of FIG. 3. Referring additionally to FIGS. 1 and 2, the C4 bonding technology utilizes pads 40 arranged in an area array in the die bonding region 22 on the top surface 24 of the substrate 14 that are separated from one another by a pitch "p". In FIG. 3, the pads 40 are positioned at lattice points 41 (only numbered along one row and one column), where each lattice point 41 is located below the midpoint of each pad 40.

In FIG. 3, the top two rows 42 and 44 of pads 40 from adjacent the die edge are rows of signal pads 46 that accommodate the transfer of various electrical signals to and from the die 12. The top two rows 42 and 44 of pads 40 closest to the die edge 48 include signal pads 46 because the majority of the logic circuitry within the die 12 is located proximate to the die edge 48 and signal traces (not shown) on the top surface 24 of the substrate 14 are typically routed outside of the die bonding region 22. The third and fourth rows 50 and 52, respectively, of pads 40 down from the die edge 48 include core power pads 54, for the transfer of power to the logic circuitry in the die 12, I/O power pads 56, for the transfer of power to the I/O interfaces in the die 12, and ground pads 58, for providing ground connections to the die. The fifth and sixth rows 60 and 62, respectively, of pads 40 down from the die edge 48 are again rows of signal pads 46. The seventh and eighth rows 64 and 66, respectively, of pads 40 are core power pads 54 and ground pads 58. Thus, power and ground pads 54 and 58, respectively, are intermingled with the signal pads 46 so as to avoid problems that occur when large numbers of signal pads 46 result in the power and ground pads 54 and 58, respectively, being located further than three to four rows away from the die edge. The three dots 68 in the upper left hand corner, upper right hand corner, and the bottom of FIG. 3 indicate that the number and spacing between the pads 40 included in the pad arrangement 38 can vary along the top surface 24 of the substrate 14 in those directions.

FIG. 3 indicates examples of the maximum distances between the die edge 48, where the logic circuitry is assumed to be located, and a core power pad 54 and an I/O power pad 56. A maximum distance between the die edge and a core power pad is approximately 3.354 p (3.354 times p), where p is the pitch or distance between the midpoints of adjacent pads 40. Also, a maximum distance between the die edge and an I/O power pad is approximately 4.272 p (4.272 times p). If p is 0.25 millimeter, the distance between the die edge and the core power pad reaches approximately 0.8385 millimeter, and the distance between the die edge and the I/O power pad reaches approximately 1.068 millimeters. These distances may result in increased DC resistance and AC inductance values.

FIG. 4 is a top plan view of underlying layers of vias 70 that connect to the pads 40 in FIG. 3. Again, the vias 70 are used to rout electrical signals, core power, I/O power, and ground potential to the layers of the substrate 14 below the top surface 24. Each via 70 includes a via hole 72 indicated by the inside circle 73 with an accompanying ring-shaped via land 74 which surrounds the via hole 72 as indicated by the second concentric circle 75. The vias 70 in each underlying layer are located directly below the corresponding pads 40 at the lattice points 41 on the top surface 24 of the substrate 14, and thus, utilize a pad-on-via structure. Accordingly, the top two rows 76 and 78 of vias 70 adjacent the die edge 48 are rows of signal vias 80 that accommodate the transfer of various electrical signals. The third and fourth rows 82 and 84, respectively, of vias 70 down from the die edge 48 include core power vias 86, I/O power vias 88, and ground vias 90. The fifth and sixth rows 92 and 94, respectively, of vias 70 down from the die edge 48 are again rows of signal vias 80. The seventh and eighth rows 96 and 98, respectively, of vias 70 are core power vias 86 and ground vias 90. The three dots 68 in the upper left hand corner, upper right hand corner, and the bottom of FIG. 4 indicate that the number and spacing between the vias 70 included in the arrangement of vias 70 can vary along each layer in those directions.

FIG. 5 is a top plan view of another C4 bonding configuration pad arrangement 100, based upon the pad arrangement 38 of FIG. 3, in which additional core power pads 54 and additional ground pads 58 are alternatingly placed in columns of core power pads 102 and columns of ground pads 104 at the interstitial points 106 (only numbered along one row and one column), where each interstitial point 106 is the mid point between four adjacent lattice points 41. Similar to FIG. 3, FIG. 5 includes signal pads 46, core power pads 54, I/O power pads 56, and ground pads 58. The three dots 68 in the upper left hand corner, upper right hand corner, and the bottom of FIG. 5 indicate that the number and spacing between the pads 40 included in the pad arrangement 100 can vary along the top surface 24 of the substrate 14 in those directions. As shown in FIG. 5, a maximum distance between a core power pad 54 and the die's logic circuitry, presumably located proximate to the die edge 48, is only approximately 1.803 p (1.803 times p). Therefore, if p equals 0.25 millimeter, the distance between the core power pad and the logic circuitry will be approximately 0.4508 millimeter. Thus, by adding core power pads 54 and ground pads 58 at the interstitial points 106, the pad arrangement 100 of FIG. 5 offers improved power distribution performance over the pad arrangement 38 of FIG. 3.

Similar to the C4 bonding configuration of FIGS. 3 and 4, the C4 bonding configuration of FIG. 5 utilizes a pad-on-via structure as shown in the top plan view of underlying layers provided by FIG. 6. Again, signal vias 80, core power vias 86, I/O power vias 88, and ground vias 90, respectively, are used to rout electrical signals, core power, I/O power, and ground potential to the layers of the substrate 14 below the top surface 24. The three dots 68 in the upper left hand corner, upper right hand corner, and the bottom of FIG. 6 indicate that the number a spacing between the vias included in the via arrangement can vary along each layer in those directions. One problem associated with the C4 bonding configuration shown in FIG. 6, is that the minimum pitch between adjacent vias is only approximately 0.707 p (0.707 times p), or approximately 0.1767 millimeters when p equals 0.25 millimeter. This is a smaller pitch between vias than that of the C4 bonding configuration of FIG. 4. The reduced via pitch is of concern when routing traces (not shown) between vias as discussed below.

Process design rules are used during semiconductor packaging design to limit the placement of adjacent metallic regions relative to one another, and thus, ensure that short circuits and/or open circuits do not occur in semiconductor devices. Process design rule values are determined, at least in part, based upon inherent limitations in the precision of the photolithography and/or etching techniques used when forming the metallic layers of the substrate 14. FIG. 7 is a magnified top plan view of two signal traces 108 routed between two adjacent vias 70 for the C4 bonding configuration of FIGS. 3 and 4. As shown in FIG. 7, if the diameter of the via land 74 is approximately 0.11 millimeter, and the process design rule is 28 micrometers, the two traces 108 having a 28 micrometer trace width can be routed between the vias 70 leaving a 28 micrometer space between adjacent metal.

FIG. 8 is a magnified top plan view of a signal trace 110 routed between two adjacent vias 70 for the C4 bonding technology configuration of FIG. 5 and 6. In contrast to FIG. 7, only one trace 110 can be routed between the vias 70. Also, a finer design spacing value of approximately 22 micrometers, instead of 28 micrometers, is required in FIG. 8. Therefore, if the C4 bonding configuration of FIGS. 5, 6, and 8 is to be used, more layers and a finer design spacing rule is required, both of which increase the overall cost for the substrate 14. Thus, there is a need to reduce the distance between the core power pads 54 and the die's logic circuitry without increasing the overall cost of the substrate by requiring more layers and finer design spacing rules.

SUMMARY OF THE INVENTION

In one aspect of the present invention, a substrate has lattice points and interstitial points. The substrate includes a surface, a plurality of pads located on the surface at interstitial points, and a plurality of vias located in the substrate only at lattice points.

In another aspect of the present invention, a semiconductor package includes a semiconductor die that has a die edge and a substrate connected to the semiconductor die that has lattice points and interstitial points. The substrate includes a surface, a plurality of pads located on the surface at interstitial points, and a plurality of vias located in the substrate only at lattice points.

In another aspect of the present invention, a method is disclosed for configuring vias in a substrate that has lattice points and interstitial points and for configuring pads on the surface of the substrate. The method includes locating pads on the surface of the substrate at interstitial points, and locating vias in the substrate only at lattice points.

It is understood that other aspects of the present invention will become readily apparent to those skilled in the art from the following detailed description, wherein is shown and described only exemplary embodiments of the invention, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Various features, aspects, and advantages of the present invention will become better understood with regard to the following description, appended claims, and accompanying drawings where:

DETAILED DESCRIPTION OF THE PREFERRED EMBODIMENTS

Figure 9:
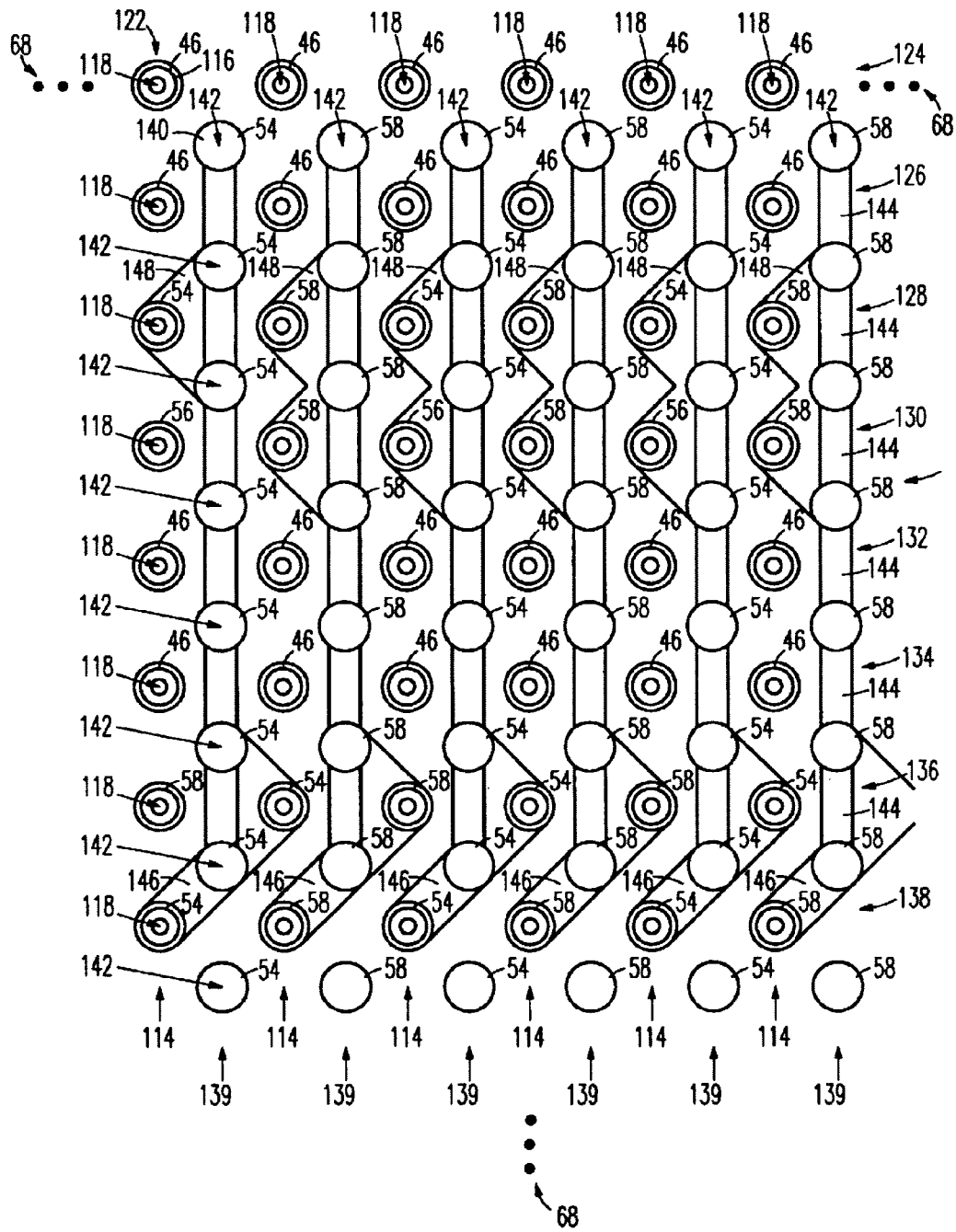
FIG. 9 is a top plan view of a pad arrangement in accordance with an exemplary embodiment of the present invention.
Figure 10:
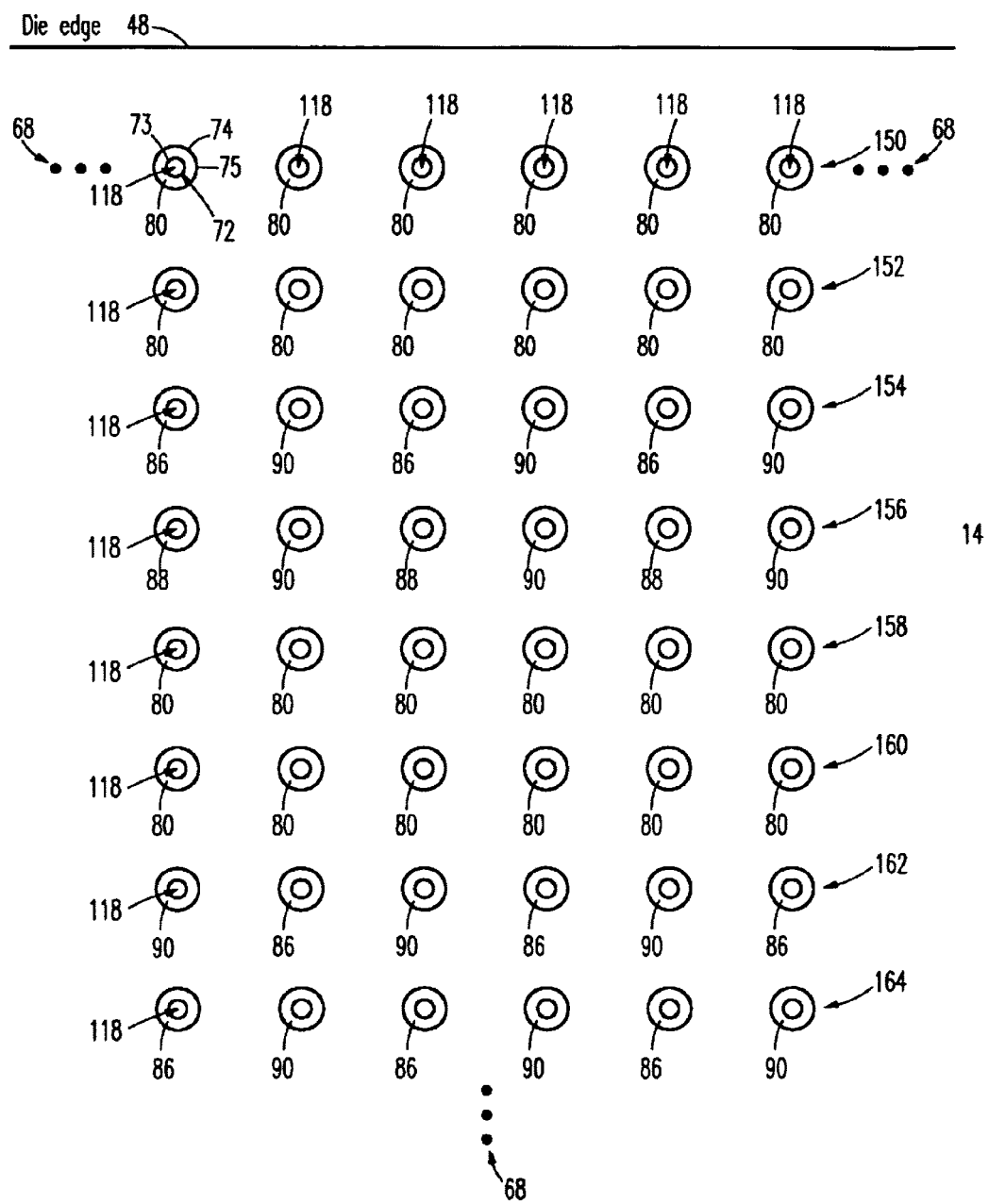
FIG. 10 is a top plan view of a via arrangement in accordance with an exemplary embodiment of the present invention.

FIG. 9 is a top plan view of a top surface 24 of a substrate 14 in a die bonding region 22 and FIG. 10 is a corresponding underlying via layer of one exemplary embodiment of the present invention. FIG. 9 shows vertical columns 114 of pads 116 located at lattice points 118 (only numbered along one row and one column). The pads 116 located at the lattice points are electrically connected to vias 120 also located at lattice points 118 (only numbered along one row and one column) that pass through lower layers of the substrate 14 as shown in FIG. 10. These pads 116 that overly the vias 120 are referred to as "pad-on-vias" and are indicated by three concentric circles 122. Pads 140 without underlying vias 120 are located at the interstitial points 142 (only numbered along one row and one column) and are merely indicated by a single circle.

In the exemplary embodiment of FIG. 9, the top two rows 124 and 126 of pad-on-vias 116 from the die edge 48 are rows of signal pads 46 that accommodate the transfer of various electrical signals to and from the die 12. The third and fourth rows 128 and 130, respectively, of pad-on-vias 116 down from the die edge 48 include core power pads 54, for the transfer of power to the logic circuitry in the die 12, I/O power pads 56, for the transfer of power to the I/O interfaces in the die 12, and ground pads 58, for providing ground connections to the die 12. The fifth and sixth rows 132 and 134, respectively, of pad-on-vias 116 down from the die edge 48 are again rows of signal pads 46. The seventh and eighth rows 136 and 138, respectively, of pad-on-vias 114 are core power pads 54 and ground pads 58.

The pad arrangement 112 of FIG. 9 also includes vertical columns 139 of pads 140 without underlying vias 120 which are located at the interstitial points 142 (only numbered along one row and one column) and may be core power pads 54 or ground pads 58. Some of the pads 140 without underlying vias 120 are electrically interconnected by wide traces 144 as shown in FIG. 9. Also, some of the pads 140 without underlying vias 120 are electrically interconnected to the pad-on-vias 116 by means of either wide traces 146 or triangular-shaped metallic layers 148. This arrangement, allows for core power and ground to pass through the vias 120 to the underlying layers of the substrate 14. The three dots 68 in the upper left hand corner, upper right hand corner, and the bottom of FIG. 9 indicate that the number and spacing between the pads 116 included in the pad arrangement 112 can vary along the top surface 24 of the substrate 14 in those directions.

Referring additionally to FIG. 10, located below the top surface 24 of the substrate 14 are vias 120 positioned in a via arrangement 149 under the lattice points 118 (only numbered along one row and one column) where the pad-on-vias 116 are located. Again, the vias 120 which are located at lattice points 118 are used to rout electrical signals, core power, I/O power, and ground potential to the layers of the substrate 14 below the top surface 24. Each via hole 72 is indicated by the inside circle 73 with an accompanying ring-shaped via land 74 which surrounds the via hole 72 as indicated by the second concentric circle 75. IN the exemplary embodiment of FIG. 10, the top two rows 150 and 152 of vias from the die edge 48 are rows of signal vias 80 that accommodate the transfer of various electrical signals. The third and fourth rows 154 and 156, respectively, of vias down from the die edge include core power vias 86, I/O power vias 88, and ground vias 90. The fifth and sixth rows 158 and 160, respectively, of vias 120 down from the die edge are again rows of signal vias 80. The seventh and eighth rows 162 and 164, respectively, of vias 120 are core power vias 86 and ground vias 90. The three dots 68 in the upper left hand corner, upper right hand corner, and the bottom of FIG. 10 indicate that the number and spacing between the vias 120 included in the via arrangement 149 can vary along each layer in those directions.

Figure 1:
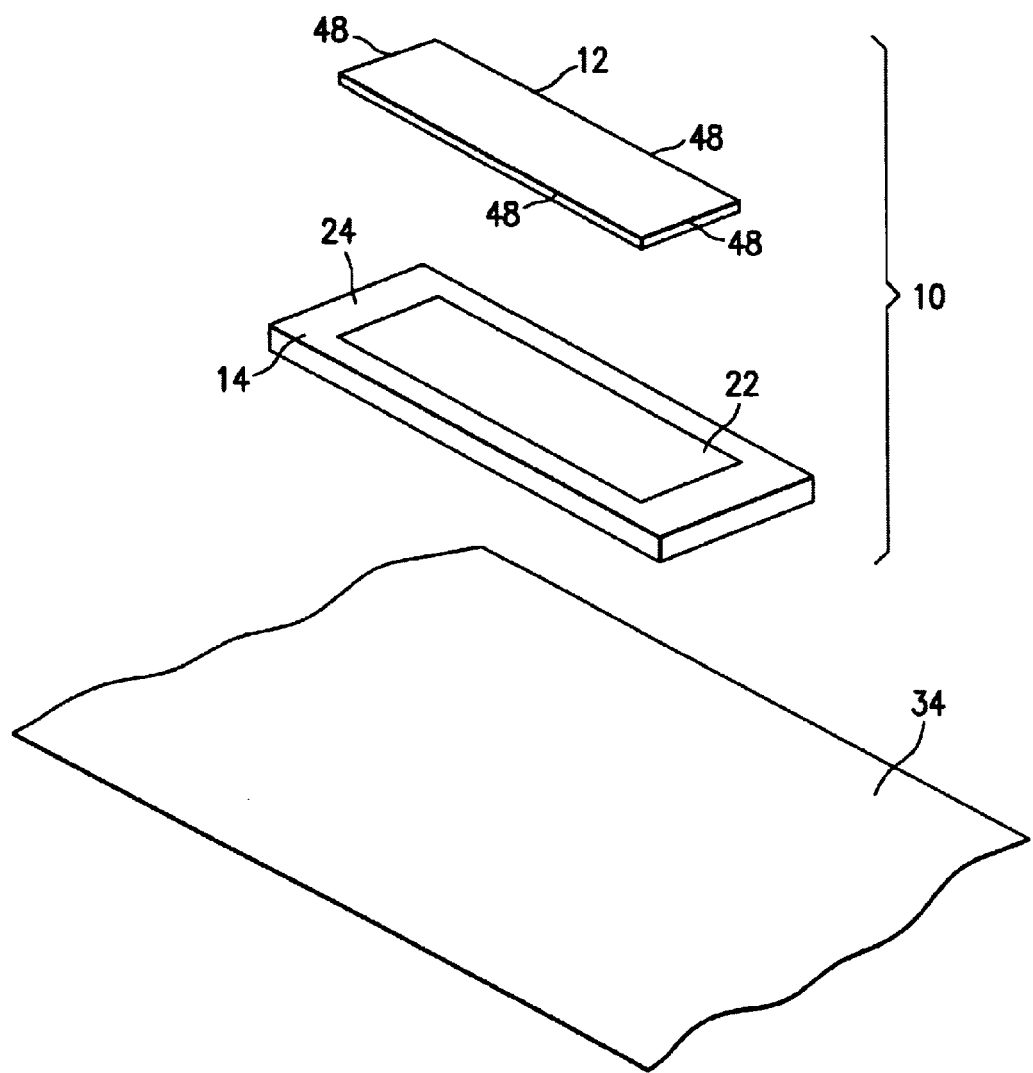
FIG. 1 is a perspective view of a conventional flip chip bonding configuration.
Figure 2:
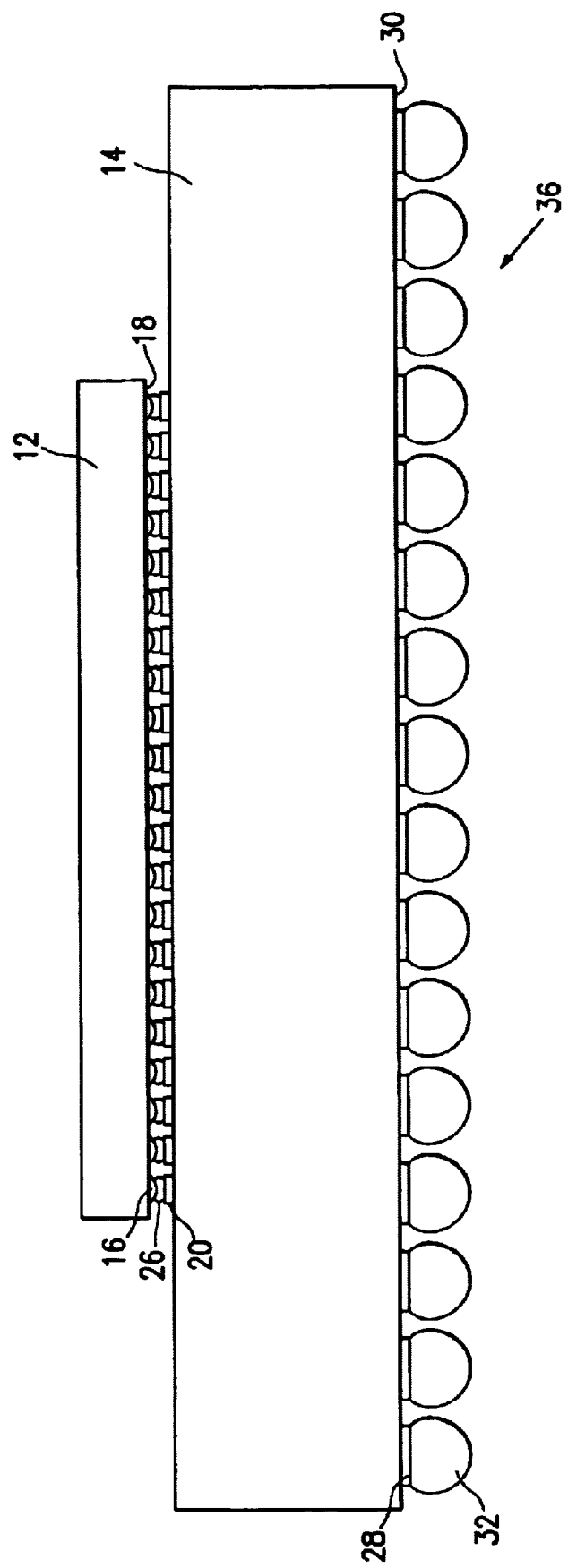
FIG. 2 is a side plan view of a die soldered to a substrate.
Figure 3:
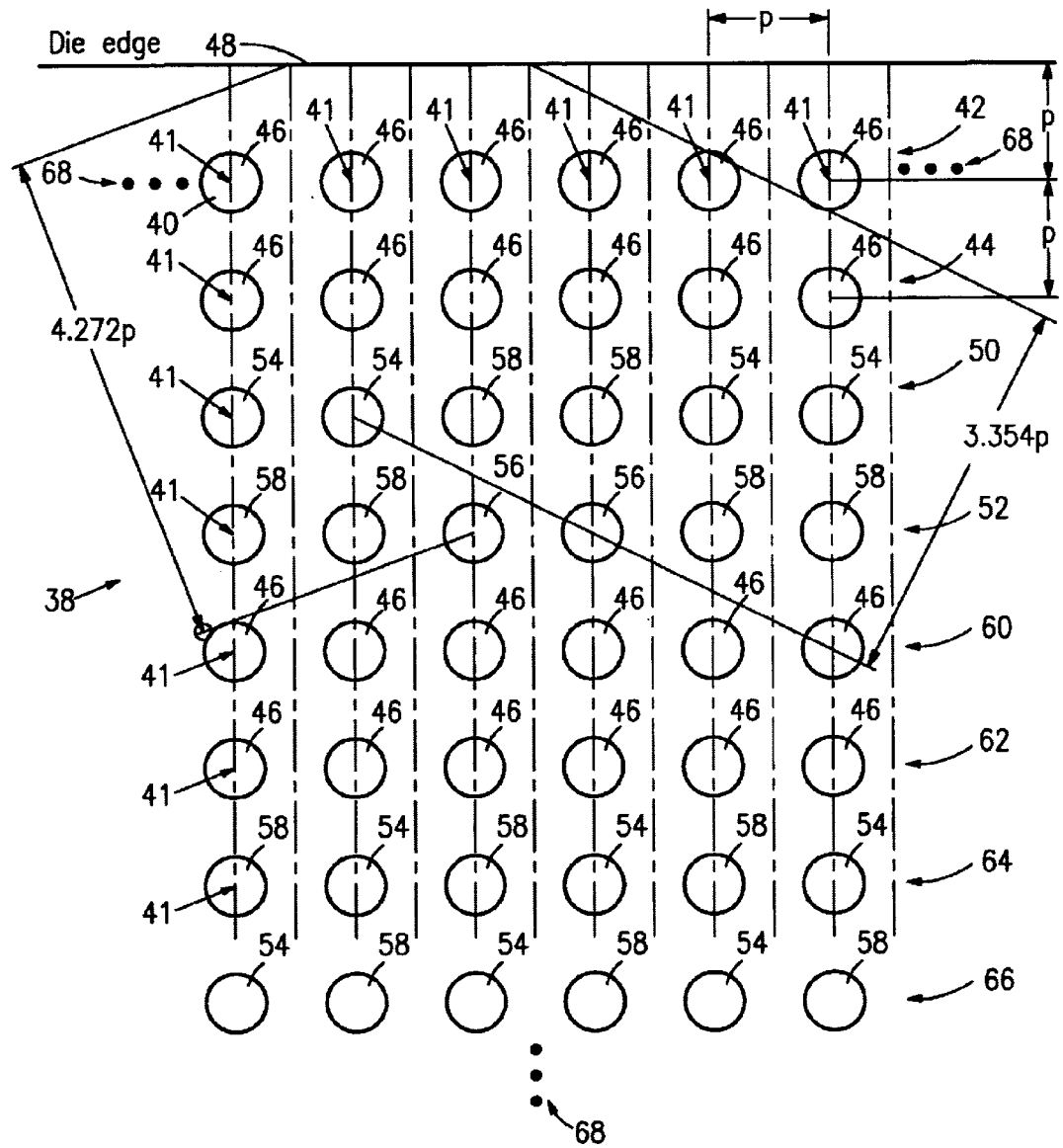
FIG. 3 is a top plan view of a prior art pad arrangement in which the pads are located at the lattice points.

Referring additionally to FIGS. 1 and 2, in operation, a die 12 is mechanically connected to the top surface 24 of the substrate 14, for example, by soldering metal bumps (not shown) on the bottom surface 18 of the die 12 to pads 20 located on the top surface 24 of the substrate 14 in the die bonding region 22. The bottom surface 30 of the substrate 14 may be mechanically connected to a motherboard 34, for example, by soldering pads 28 on the bottom surface 30 of the substrate 14 to pads (not shown) on the motherboard 34. Since the die 12, substrate 14, and motherboard 34 are electrically interconnected, electrical signals, core power, I/O power, and ground can be electrically coupled through the substrate 14, by means of the pads 20 and 28, respectively, on both the substrate's top surface 24 and bottom surface 30, and the substrate's vias 120, to and from the die's internal circuitry, i.e., logic circuitry and I/O circuitry.

Figure 4:
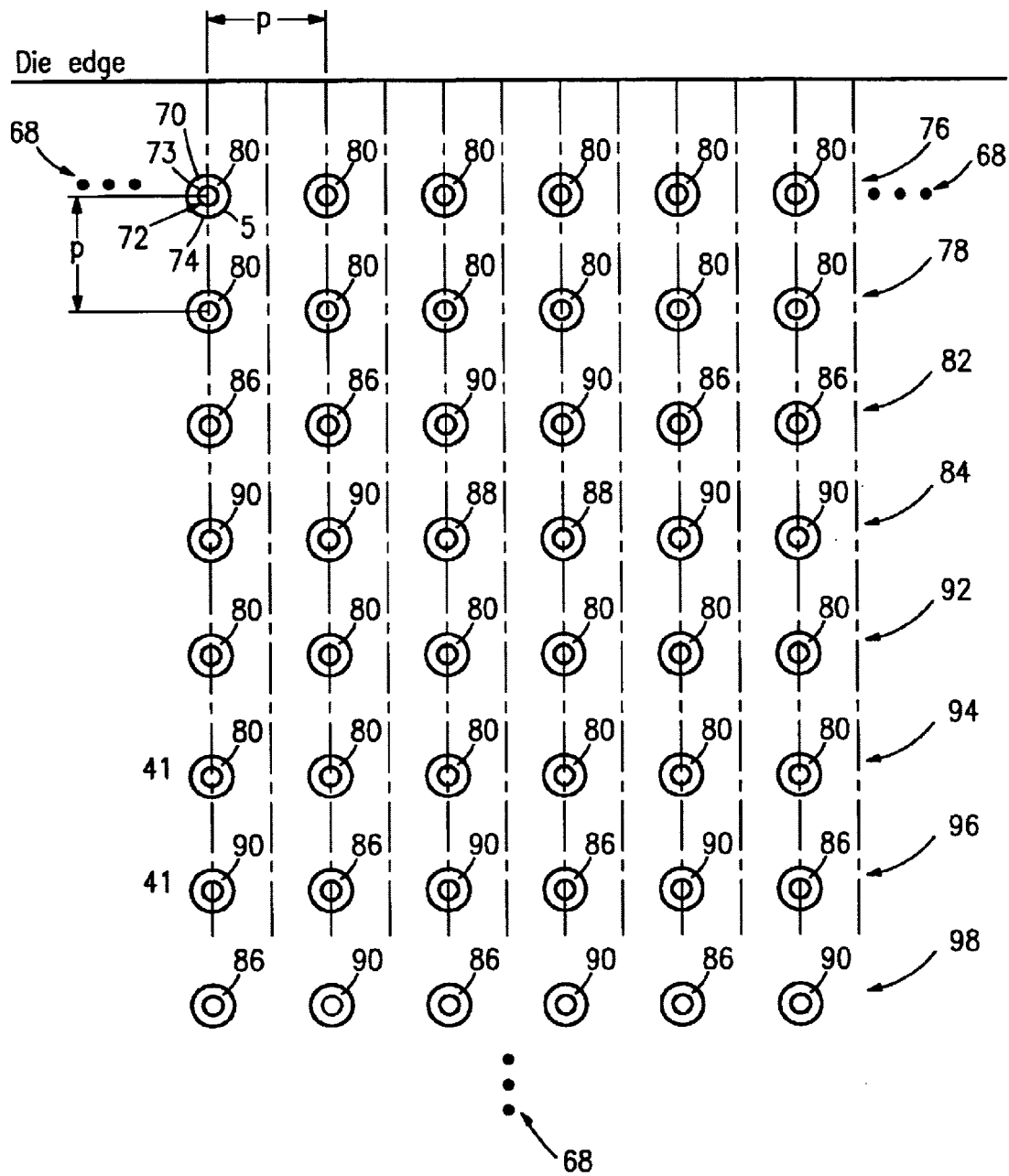
FIG. 4 is a top plan view of a prior art via arrangement in which the vias are located at the lattice points.
Figure 5:
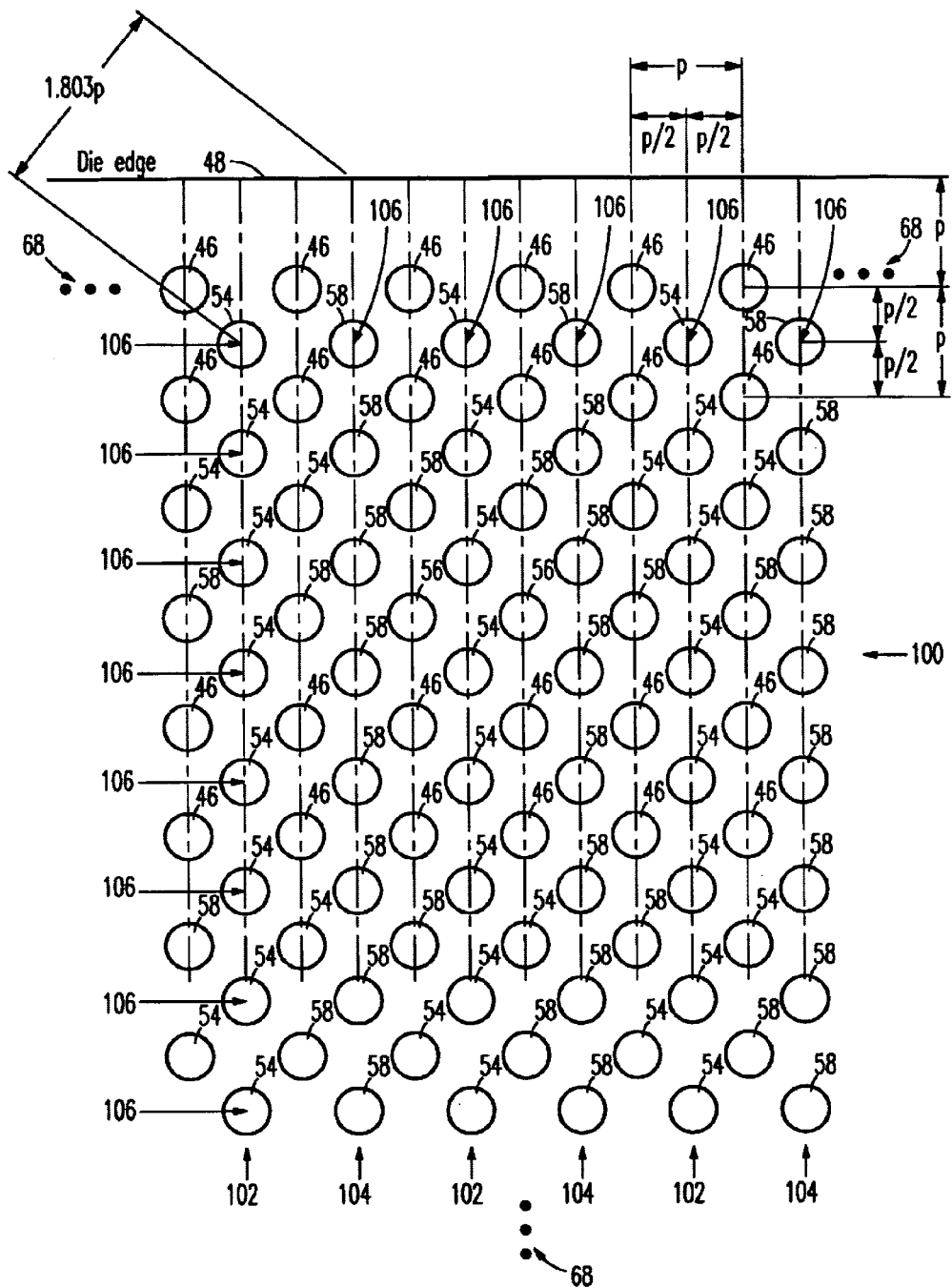
FIG. 5 is a top plan view of a prior art pad arrangement in which pads are located at both the lattice points and the interstitial points.
Figure 6:
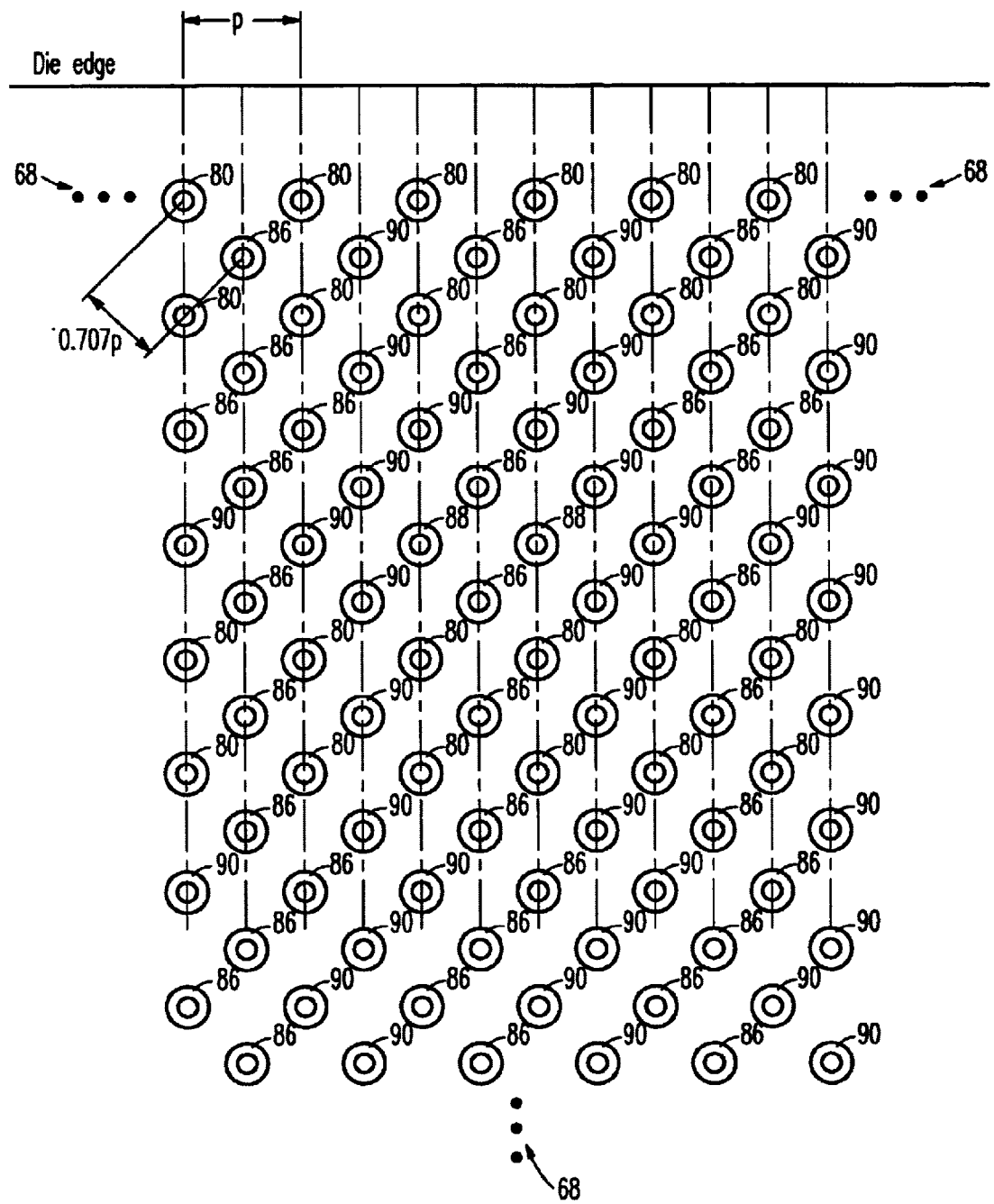
FIG. 6 is a top plan view of a prior art via arrangement in which the vias are located at both the lattice points and interstitial points.
Figure 8:
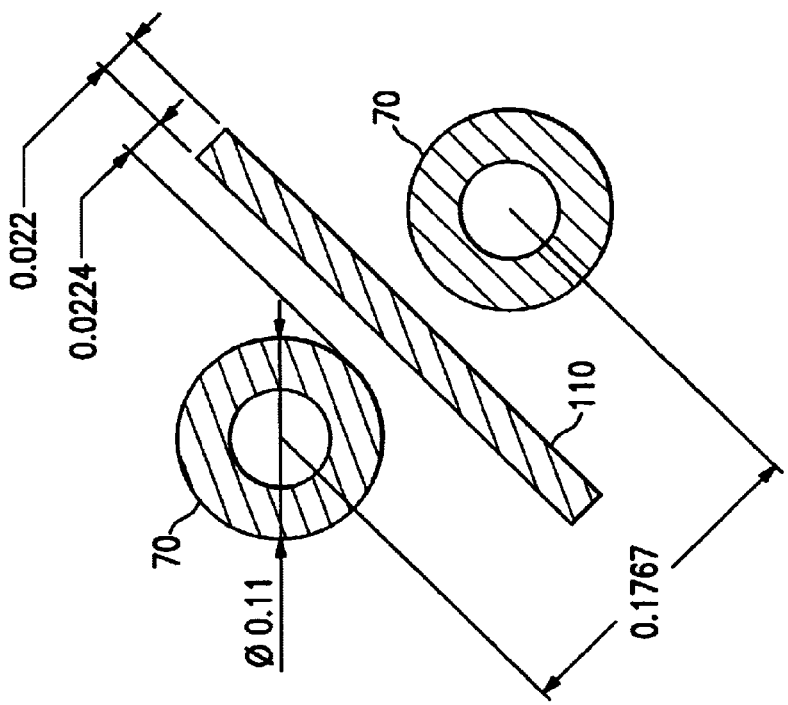
FIG. 8 is a top plan view of two vias and a trace in accordance with the via arrangement of FIG. 6.
Figure 7:
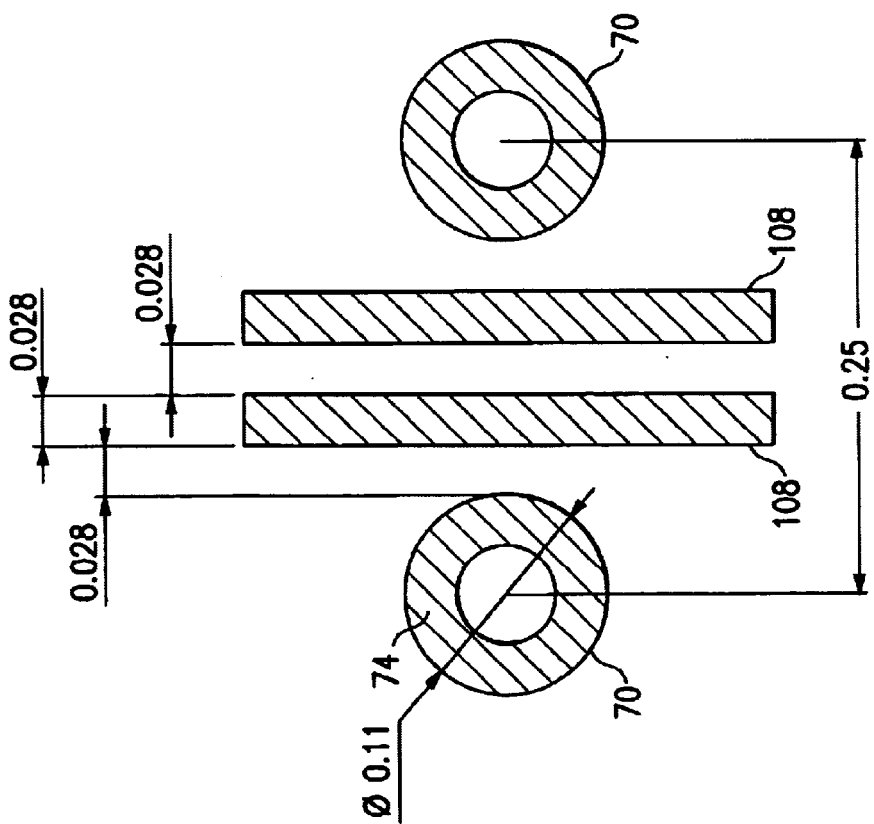
FIG. 7 is a top plan view of two vias and two traces in accordance with the via arrangement of FIG. 4.

The present invention advantageously offers a reduction in the distance between core power, I/O power, and ground pads 54, 56, and 58, respectively, and the logic circuitry located near the die edge 48. Embodiments of the present invention also maintain the via spacing of FIGS. 4 and 7, thus, allowing for at least two traces 108 to be routed between adjacent via lands 74 and eliminating the need for additional layers and narrower design spacing, both of which increase the overall cost of the substrate 14. In addition, the present invention provides wide traces 144 for core power and ground distribution which reduce DC resistance and AC inductance. Thus, the present invention provides improved performance over the C4 bonding pad and via configurations of FIGS. 3–8. Therefore, the present invention provides improved power distribution while maintaining conventional design spacing conventions.

Although exemplary embodiments of the present invention have been described, they should not be construed to limit the scope of the appended claims. Those skilled in the art will understand that various modifications may be made to the described embodiments. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A substrate, having lattice points and interstitial points, comprising:
   a surface;
   a plurality of pads located on the surface at the lattice points and the interstitial points;
   a plurality of vias formed in the substrate to be located at the lattice points and not located at at least one of the interstitial points, wherein the substrate is for interconnecting to a semiconductor die having a die edge and at least some of the plurality of pads are located on the surface at interstitial points adjacent the die edge; and
   at least one signal pad, for electrically coupling an electrical signal in and out of the semiconductor die, located on the surface at a lattice point closer to the die edge than the interstitial points.

2. The substrate according to claim 1, wherein each via is electrically coupled to a pad located at a lattice point.

3. The substrate according to claim 1, wherein the pads located at the interstitial points are core power pads or ground pads.

4. The substrate according to claim 3, wherein at least one core power pad located at an interstitial point is electrically coupled to another core power pad located at an interstitial point by a trace.

5. The substrate according to claim 1, wherein no vias are formed at the interstitial points in the substrate.

6. A substrate, having lattice points and interstitial points, comprising:
   a surface;
   a plurality of pads located on the surface at the lattice points and the interstitial points, wherein the pads located at the interstitial points are core power pads or ground pads, and wherein at least one core power pad located at an interstitial point is electrically coupled to a pad located at a lattice point; and
   a plurality of vias formed in the substrate to be located at the lattice points and not located at at least one of the interstitial points.

7. A substrate, having lattice points and interstitial points, comprising:
   a surface;
   a plurality of pads located on the surface at the lattice points and the interstitial points, wherein the pads located at the interstitial points are core power pads or ground pads, and wherein at least one ground pad located at an interstitial point is electrically coupled to a pad located at a lattice point; and
   a plurality of vias formed in the substrate to be located at the lattice points and not located at at least one of the interstitial points.

8. A substrate, having lattice points and interstitial points, comprising:
   a surface;
   a plurality of pads located on the surface at the lattice points and the interstitial points, wherein the pads located at the interstitial points are core power pads or ground pads, and wherein at least one ground pad located at an interstitial point is electrically coupled to another ground pad located at an interstitial point by a trace; and
   a plurality of vias formed in the substrate to be located at the lattice points and not located at at least one of the interstitial points.

9. A semiconductor package comprising:
   a semiconductor die having a die edge; and
   a substrate, having lattice points and interstitial points, connected to the semiconductor die, the substrate including;
   a surface;
   a plurality of pads located on the surface at the lattice points and the interstitial points;
   a plurality of vias formed in the substrate to be located at the lattice points and not located at least one of the interstitial points; and
   at least one signal pad, for electrically coupling an electrical signal in and out of the semiconductor die, located on the surface at a lattice point closer to the die edge than the interstitial points.

10. The semiconductor package according to claim 9, wherein at least some of the plurality of pads are located on the surface at interstitial points adjacent the die edge.

11. The semiconductor package according to claim 9, wherein the pads located at the interstitial points are core power pads or ground pads.

12. The semiconductor package according to claim 11, wherein at least one core power pad located at an interstitial point is electrically coupled to another core power pad located at an interstitial point by a trace.

13. The semiconductor package according to claim 9, wherein no vias are formed at the interstitial points in the substrate.

14. A semiconductor package comprising:
   a semiconductor die having a die edge; and
   a substrate, having lattice points and interstitial points, connected to the semiconductor die, the substrate including;
   a surface;
   a plurality of pads located on the surface at the lattice points and the interstitial points, wherein the pads located at the interstitial points are core power pads or ground pads; and
   a plurality of vias formed in the substrate to be located at the lattice points and not located at least one of the interstitial points;

wherein at least one core power pad located at an interstitial point is electrically coupled to a pad located at a lattice point.

15. A semiconductor package comprising:

a semiconductor die having a die edge; and a substrate, having lattice points and interstitial points, connected to the semiconductor die, the substrate including;

a surface;

a plurality of pads located on the surface at the lattice points and the interstitial points, wherein the pads located at the interstitial points are core power pads or ground pads; and a plurality of vias formed in the substrate to be located at the lattice points and not located at least one of the interstitial points;

wherein at least one ground pad located at an interstitial point is electrically coupled to a pad located at a lattice point.

16. A semiconductor package comprising:

a semiconductor die having a die edge; and a substrate, having lattice points and interstitial points, connected to the semiconductor die, the substrate including:

a surface;

a plurality of pads located on the surface at the lattice points and the interstitial points, wherein the pads located at the interstitial points are core power pads or ground pads; and a plurality of vias formed in the substrate to be located at the lattice points and not located at least one of the interstitial points;

wherein at least one ground pad located at an interstitial point is electrically coupled to another ground pad located at an interstitial point by a trace.

* * * * *